(12) United States Patent
Barshilia et al.

(10) Patent No.: US 7,585,568 B2
(45) Date of Patent: Sep. 8, 2009

(54) SOLAR SELECTIVE COATING HAVING HIGHER THERMAL STABILITY USEFUL FOR HARNESSING SOLAR ENERGY AND A PROCESS FOR THE PREPARATION THEREOF

(75) Inventors: Harish Chandra Barshilia, Karnataka (IN); Vatika Krishnamurthy William Grips, Karnataka (IN); Karaikudi Sankaranarayana Rajam, Karnataka (IN)

(73) Assignee: Council of Scientific & Industrial Research, New Delhi (IN)

( * ) Notice: Subject to any disclaimer, the term of this patent is extended or adjusted under 35 U.S.C. 154(b) by 95 days.

(21) Appl. No.: 11/466,266

(22) Filed: Aug. 22, 2006

(65) Prior Publication Data

US 2007/0196670 A1    Aug. 23, 2007

(30) Foreign Application Priority Data

Feb. 21, 2006    (IN) .......................... 478/DEL/2006

(51) Int. Cl.
*B32B 9/04* (2006.01)
*B32B 13/04* (2006.01)
(52) U.S. Cl. .................. 428/446; 428/469; 428/432; 428/472
(58) Field of Classification Search .............. 428/690, 428/34.4, 34.6, 655, 432, 469, 472, 446; 204/192.26, 192.22, 192.27, 192.28
See application file for complete search history.

(56) References Cited

U.S. PATENT DOCUMENTS 5,523,132 A * 6/1996 Zhang et al. ............... 428/34.4

2004/0241490 A1 * 12/2004 Finley ........................ 428/655
2005/0258030 A1 * 11/2005 Finley et al. ........... 204/192.26

FOREIGN PATENT DOCUMENTS

WO    WO-2005010225    * 2/2005

OTHER PUBLICATIONS

Tonshoff et al. "Performance of oxygen-rich TiAlON coatings in dry cutting applications". online Jan. 7, 2000. (http://www.sciencedirect.com).*
Barshilla et al. Superhard nanocomposite coatings of TiN/Si3N4 prepared by reactive direct current unbalanced magnetron sputtering online Jan. 18, 2006. (Surface and Coatings Technology 201 (2006) 329-337).*

* cited by examiner

Primary Examiner—Timothy M Speer
Assistant Examiner—Lauren Robinson
(74) Attorney, Agent, or Firm—Luedeka, Neely & Graham, PC

(57) ABSTRACT

The disclosure provides an improved solar selective multi-layer coating having higher thermal stability and a process therefor. According to the disclosure, a tandem stack of three layers of TiAlN, TiAlON and $Si_3N_4$ is deposited on metal and non-metal substrates using a planar reactive magnetron sputtering process. The first two layers function as the absorber and the third antireflection layer further enhances the coating's absorptance. The solar selective coatings were annealed in air and vacuum to test the thermal stability at different temperatures and durations. The coatings deposited on copper substrates are stable in air up to a temperature of 625° C. and exhibit higher solar selectivity and these coatings also show no change in the absorptance and the emittance values even after vacuum annealing at 600° C. for 3 hours. The solar selective coatings exhibit high hardness, high oxidation resistance, chemical inertness and stable microstructure.

14 Claims, No Drawings

SOLAR SELECTIVE COATING HAVING HIGHER THERMAL STABILITY USEFUL FOR HARNESSING SOLAR ENERGY AND A PROCESS FOR THE PREPARATION THEREOF

FIELD OF THE INVENTION

The present invention relates to an improved solar selective coating having higher thermal stability useful for harnessing solar energy and a process for the preparation thereof.

The present invention more particularly relates to a multi-layer solar selective coating containing tandem stacks of titanium-aluminum nitride, titanium-aluminum oxynitride and silicon nitride manufactured using a planar reactive direct current (DC) magnetron sputtering technique.

BACKGROUND OF THE INVENTION

Solar selective coatings are used as absorbers for harnessing solar energy for various applications. One of the essential requirements of solar selective absorbers is their stable structural composition when they operate at high temperatures. Optical properties of these coatings should not degrade with respect to rise in temperature or over a period of use. The main utility of the present invention is for high temperature applications particularly in solar steam generators and steam turbines for producing the electricity. It also finds applications for obtaining decorative coatings, wherein the coating should have higher thermal stability, such as exhaust and silencer pipes in automobile engines.

In recent years a greater attention has been shown in harnessing alternative sources of energy like solar energy for industrial applications, where the electricity is used in large quantities to produce steam for various industrial processes. Generally, concentrating type solar collectors are popularly used in industries for high temperature applications. Solar selective coatings applied to solar absorbers have been proved as an efficient method for harnessing the solar energy on large scale. These solar selective coatings are deposited by both wet and dry methods on the substrates. Most of the coatings obtained from the wet methods do not exhibit higher thermal and chemical stability. In addition, these processes are not environmentally friendly.

Conventionally, black chrome is used as an excellent solar selective coating for hot-water applications, which is deposited by electroplating an aqueous solution of sulphate-free chromic acid containing certain additives. This is a wet process and utilizes hexavalent chromium. Hexavalent chromium ions are known carcinogens and are being phased out in many applications. When chromic acid solution is electrolyzed it produces a lot of hydrogen and oxygen, which carry chromic acid and escapes to atmosphere, affecting the environment, thus causing pollution problems. Any chromic acid containing solution cannot be discharged to the drainage because it causes soil and ground water pollution problems. In general, black chrome coatings are used for low temperature applications like solar water heating. In evacuated tubes, black chrome coatings have also been used for steam generation at low pressures, wherein the application temperature is around 200° C. However, for high-temperature applications, like solar steam turbines, black chrome coatings are not recommended, since they undergo compositional changes.

Among the dry coating methods, chemical vapor deposition (CVD) generally utilizes higher deposition temperature and also toxic chemicals. The solar selective multilayer coatings of the present invention have been deposited by using a planar reactive DC magnetron sputtering process. The planar reactive DC magnetron sputtering process is most widely used physical vapor deposition (PVD) method. Also, DC magnetron sputtering is a dry, clean and eco-friendly green process for depositing a variety of coatings. In harnessing solar energy for steam generation, coatings with higher thermal stability are required. In the sputtering method it is possible to precisely control the stoichiometry of the coating and also the deposition temperature is generally low (room temperature to 400° C.). High melting point metal nitrides (including transition metal nitrides) with controlled microstructure can be deposited by sputtering, which are chemically inert and very hard. Furthermore, this method can be scaled up for industrial applications.

Prior-art search was made in public domain for patent as well as non-patent literature to differentiate the present invention with other inventors' work. Some of the works, which are related to the field of the present invention, are discussed below.

Reference may be made to "Pt—$Al_2O_3$ selective cermet coatings on superalloy substrates for photo-thermal conversion up to 600° C." by T. K. Vien et al. [Thin Solid Films 126 (1985) 17], wherein platinum-aluminum oxide (Pt—$Al_2O_3$) cermet solar selective films have been deposited using a radio frequency (RF) sputtering technique. They obtained coatings with $\alpha=0.92$ and $\epsilon_{300°\,C.}=0.14$ on stainless steel and superalloy substrates. They claimed that these coatings were stable up to 600° C. on superalloy substrates after annealing in hydrogen atmosphere. In many applications the solar selective coatings are required to have higher thermal stability in air. This work has discussed thermal stability only in hydrogen atmosphere but not in air or vacuum.

Reference may be made to "Recent progress in high-temperature solar selective coatings" by Q.-C. Zhang et al. [Solar Energy Materials & Solar Cells 62 (2000) 63 and references therein], wherein a series of metal-AlN and Mo—$Al_2O_3$ cermet materials have been deposited by a DC magnetron sputtering process. They have reported a solar absorptance of 0.96 and a hemispherical emittance of 0.11 at 350° C. for $Al_2O_3$/Mo—$Al_2O_3$ (low metal volume fraction)/Mo—$Al_2O_3$ (high metal volume fraction)/Mo films. Solar absorptance of 0.96 and near normal emittance of 0.08 at 350° C. were achieved for Mo—$Al_2O_3$ cermet coatings on copper infrared reflectors. They have also reported that stainless steel-aluminum nitride (SS-AlN), tungsten-aluminum nitride (W—AlN) and molybdenum-aluminum nitride (Mo—AlN) cermet coatings exhibit good thermal stability in the temperature range of 350-500° C. in vacuum. They have not reported the thermal stability of these coatings in air.

Reference may be made to "Sputter etched metal solar selective absorbing surfaces for high temperature thermal collectors" by G. L. Harding and M. R. Lake [Solar Energy Materials 5 (1981) 445], wherein sputter etched Cu-SS-Ni substrates have been produced in a cylindrical magnetron with $\alpha=0.92$ and $\epsilon_{27°\,C.}=0.12\text{-}0.25$. Sputter etched copper surfaces were stable in vacuum up to 400° C. and stainless steel surfaces were stable in vacuum up to 500° C. These surfaces deteriorated in air at 400° C.

Reference may be made to "High-temperature optical properties and stability of $Al_xO_y$—$AlN_x$—Al solar selective absorbing surface prepared by DC magnetron reactive sputtering" by S. Yue et al. [Solar Energy Materials & Solar Cells 77 (2003) 393], wherein $Al_xO_y$—$AlN_x$—Al solar selective absorber coatings have been deposited using DC magnetron reactive sputtering of aluminum alloy in air and argon. These coatings were found to be stable up to 600° C. for 30 minutes in $4.5\times10^{-3}$ Pa vacuum with $\alpha=0.94$ and $\epsilon=0.07$. After heating at 450° C. for 10 hours in vacuum the specimen showed α=0.93 and ε=0.07. Tests in air have not been conducted.

Reference may be made to Chinese Patent No. 01138135.3, wherein solar selective films consisting of reflection and absorption layers were deposited on metal and glass substrates using magnetic control reactive vacuum deposition system. The absorption layer was deposited by sputtering Ti and Al as cathodes in $N_2$, air medium and $N_2+O_2$ to form (AlN+TiN)—AlTi films. The infrared reflection layer was Ti+Al of thickness 0.09 μm (900 Å). The absorber layer was (AlN+TiN) and AlNO+TiNO of thickness 0.15 to 0.4 μm. The thickness of the reflection reduction layer was 0.04-0.2 μm. The film was heated for 250 hours at 350° C. or 50 hours at 400° C. or 80 hours at 450° C. in air. They have claimed α=0.93 and ε=0.06-0.10. The Ti+Al and TiN coatings used in this invention are susceptible to oxidation at higher temperature, thus affecting the optical properties of the solar selective coatings.

Reference may also be made to "Optimization of $SiO_2$—$TiN_xO_y$—Cu interference absorbers: numerical and experimental results" by M. P. Lazarov et al. [Proceedings of the Society for Photothermal Instrumentation Engineers (SPIE) 2017 (1993) 345], wherein $TiN_xO_y$ solar selective coatings have been developed on Al and Cu substrates using activated reactive evaporation with $SiO_2$ as antireflection coating. Best coatings showed α=0.94 and $\epsilon_{100° C.}$=0.04. They claimed that the coatings withstand breakdown in cooling fluid and vacuum if mounted on evacuated collector.

Reference may also be made to TiNOX based absorber coatings [http://www.tinox.com/], wherein TiNOX GmbH, is currently marketing TiNOX solar absorber coatings. They use $SiO_2$ as the protective layer. TiNOX has reported α=0.94 and ε=0.05 for their coatings. It has been claimed that non-vacuum collectors equipped with TiNOX reach temperature up to 220° C. and vacuum tubes reach temperature as high as 325° C.

Reference may also be made to "TiAlON black decorative coatings deposited by magnetron sputtering" by R. Luthier and F. Levy [Vacuum 41 (1990) 2205], wherein titanium-aluminum oxynitride (TiAlON) black decorative coatings have been developed using planar RF magnetron sputtering of $Al_2O_3$+1.5TiN target on sapphire substrates. They have claimed that the coatings were stable up to 900° C. under vacuum. However, they have not studied the optical properties of the coatings.

Reference may also be made to "Performance of oxygen-rich TiAlON coatings in dry cutting application" by K. Tonshoff et al. [Surface and Coatings Technology 108-109 (1998) 535], wherein graded and multilayer coatings of TiAlN/TiAlON have been deposited with varying oxygen contents for dry cutting applications using an RF assisted magnetron sputter ion plating and a conventional magnetron sputter ion plating. They have studied only wear resistance in dry drilling of tempered steel for 7-layered film with alternating films of TiAlN and TiAlON. They have not discussed anything about solar selective properties of these coatings.

As seen from the prior art literature, various researchers have tried to manufacture solar selective coatings with higher thermal stability. Best coatings as reflected in the prior art have thermal stability up to 400-450° C. and solar selectivity in the range of 9-10. But still the problem of improved thermal stability above 450° C. exists. It is also desired that the solar selective coatings should have high oxidation resistance, chemical inertness and high hardness for high temperature applications. There is a definite scope to provide solution to such kind of problems in order to expand the life of the solar selective coating having higher thermal stability. Hence, there is a definite need to manufacture such solar selective coatings having higher thermal stability, which obviate the drawbacks of the prior art, as mentioned earlier.

OBJECTIVES OF THE INVENTION

The main objective of the present invention is to provide an improved solar selective multilayer coating having higher thermal stability.

Another objective of the present invention is to manufacture solar selective multilayer coatings prepared by planar reactive direct current magnetron sputtering process.

Yet another objective of the present invention is to obtain solar selective multilayer coatings prepared by planar reactive direct current magnetron sputtering having chemical inertness, corrosion resistance and higher humidity resistance.

Yet another objective of the present invention is to manufacture solar selective multilayer coatings prepared by planar reactive direct current magnetron sputtering with high hardness and with high abrasion resistance.

Yet another objective is to obtain solar selective multilayer coatings prepared by planar reactive direct current magnetron sputtering having very high oxidation resistance.

Yet another objective is to produce solar selective multilayer coatings having higher solar selectivity ratio.

Yet another objective is to deposit solar selective multilayer coatings having higher thermal stability by using planar reactive direct current magnetron sputtering on flat reflecting substrates such as copper, stainless steel, glass, aluminum, nickel and nickel containing superalloy (nimonic).

Yet another objective is to provide solar selective coatings having very high thermal resistance suitable for concentrating collectors like evacuated tubes.

Still another objective is to provide solar selective multilayer coatings for solar steam generation.

Still another objective of the present invention is to produce decorative coatings with higher thermal stability suitable for exhaust and silencer pipes in automobile engines.

Novelty of the present invention is in providing a multilayer solar selective coating having very high thermal stability in air at 400-600° C. and high solar selectivity in the order of 9-10. The first absorber layer TiAlN has got high temperature stability and better oxidation resistance (750-800° C.) as compared to titanium nitride (400-450° C.).

The first absorber layer of TiAlN has also got high hardness. The second absorber layer TiAlON has also got higher thermal stability and higher hardness. Similarly, the third antireflection layer $Si_3N_4$ has got very high oxidation resistance (1400-1600° C.) and high hardness. Thus the combination of layers selected in the present invention provides thermally stable, high oxidation resistant, chemically inert, stable microstructure, graded composition solar selective absorber coating useful for high temperature applications.

The above mentioned novelty of the present invention has been achieved by adopting the following non-obvious inventive steps:

1. Deposition of tandem stack of multilayer coatings comprising two absorber layers in which the first absorber layer is tailor made to have high metal volume fraction and the second absorber layer having low metal volume fraction for enhancing the absorption of the coating.
2. Providing third antireflection layer for reducing the infrared emittance so as to increase the absorption further.
3. Carefully selecting the candidate materials for depositing TiAlN, TiAlON and $Si_3N_4$ layers so that the inter-diffusion between the layers of the tandem stack is minimal and the microstructure is stable even at higher working temperatures.

SUMMARY OF THE INVENTION

Accordingly, the present invention provides an improved solar selective coating having higher thermal stability useful for harnessing solar energy comprising first solar absorber layer of TiAlN being deposited on a substrate selected from glass, silicon and metal, the said first absorber layer being deposited by another second solar absorber layer and a third antireflection layer of TiAlON and $Si_3N_4$, respectively.

In an embodiment the said improved solar selective coating having higher thermal stability useful for harnessing solar energy comprising first absorber layer of TiAlN being deposited on a substrate selected from glass, silicon and metal, the said first absorber layer being deposited by another second absorber layer and a third antireflection layer of TiAlON and $Si_3N_4$, respectively, has the following characteristics:
  i) having first absorber layer thickness of 300-500 Å, second absorber layer thickness of 400-800 Å and third antireflection layer thickness of 300-500 Å,
  ii) high absorptance of 0.92-0.95 and low emittance of 0.06-0.08 on copper substrates,
  iii) thermally stable in air up to 600° C. for a duration of 2 hours with a solar selectivity of 9-10 on copper substrate,
  iv) thermally stable in vacuum ($5.0 \times 10^{-4}$ Pa) for a duration of 3 hours at 600° C.,
  v) thermally stable in air at 525° C. for a duration of 50 hours with a solar selectivity of 10 on copper substrate,
  vi) approximately 4500 Å thick coating on copper substrate exhibits a nanoindentation hardness of 1170 kg/mm² at a load of 3 mN,
  vii) coatings deposited on silicon substrate show oxidation resistance up to 850° C., In yet another embodiment the elements used in depositing the first absorber layer are Ti, Al and N.

In yet another embodiment the elements used in depositing the second absorber layer are Ti, Al, O and N.

In yet another embodiment the elements used in depositing the antireflection layer are Si and N.

In yet another embodiment the titanium-aluminum composite target is sputtered in the presence of nitrogen-argon plasma for the deposition of first absorber layer of TiAlN.

In yet another embodiment the titanium-aluminum composite target is sputtered in the presence of nitrogen-argon-oxygen plasma for the deposition of second absorber layer of TiAlON.

In yet another embodiment the silicon target is sputtered in the presence of nitrogen-argon plasma for the deposition of third antireflection layer of $Si_3N_4$.

The present invention further provides a process for the preparation of an improved solar selective coating having higher thermal stability useful for harnessing solar energy, the said process comprising the steps of:
  i) polishing and chemically cleaning the substrate by known methods, and subsequent cleaning by argon ion bombardment, under vacuum at a pressure of $1.0-3.0 \times 10^{-1}$ Pa,
  ii) depositing a solar absorber layer of TiAlN on the above said cleaned substrate by DC magnetron sputtering of titanium-aluminium (Ti—Al) composite target in the presence of argon-nitrogen plasma, at a pressure of 0.1-0.5 Pa, at a flow rate of nitrogen of 2-3 standard cubic centimeter per minute (sccm), at a power density of 2.25-6.25 watts/cm² and at a substrate temperature of 25-50° C.,
  iii) depositing another solar absorber layer of TiAlON on the above said layer of TiAlN deposited on the substrate by DC magnetron sputtering of titanium-aluminium (Ti—Al) composite target, in the presence of argon-oxygen-nitrogen plasma, at a pressure of 0.1-0.5 Pa, at a flow rate of nitrogen of 2-3 standard cubic centimeter per minute (sccm), at a flow rate of oxygen of 1-2 sccm, at a power density of 2-6 watts/cm² and at a substrate temperature of 25-50° C.,
  iv) further depositing a third antireflection layer of $Si_3N_4$ on the above said second solar absorber layer of TiAlON by using DC magnetron sputtering of silicon, in the presence of argon-nitrogen plasma, at a pressure of 0.1-0.5 Pa, at a flow rate of nitrogen of 2-3 sccm, at a power density of 2-6 watts/cm² and at a substrate temperature of 25-50° C. to obtain the desired solar selective coating of substrate/TiAlN/TiAlON/$Si_3N_4$.

In yet another embodiment the substrate used is selected from metal and non metal substrates.

In yet another embodiment the substrate used is selected from the group consisting of copper, nickel, stainless steel, glass and nimonic.

In yet another embodiment the vacuum chamber is maintained at a base pressure of $3.0-6.0 \times 10^{-4}$ Pa before deposition of the coatings.

In yet another embodiment the coatings are deposited at an operating pressure in the range of 0.1-0.5 Pa.

In yet another embodiment the solar selective multilayer coatings are deposited at a substrate temperature of 25-40° C.

In yet another embodiment the solar selective multilayer coatings are deposited at a substrate to target distance of 4-6 cm.

In yet another embodiment the thickness of the first absorber layer coating is in the range of 300-500 Å.

In yet another embodiment the thickness of the second absorber layer coating is in the range of 400-800 Å.

In yet another embodiment the thickness of the third antireflection layer is in the range of 300-500 Å.

In yet another embodiment the solar selective multilayer coatings obtained have high absorptance of 0.92-0.95 and low emittance 0.06-0.08 on copper substrates.

In yet another embodiment the solar selective multilayer coatings on copper substrate are thermally stable in air up to 600° C. for a duration of 2 hours with a solar selectivity of 9-10.

In yet another embodiment the solar selective multilayer coatings are thermally stable in vacuum ($5.0 \times 10^{-4}$ Pa) for a duration of 3 hours at 600° C.

In yet another embodiment the solar selective coatings on copper substrate are thermally stable in air at 525° C. for a duration of 50 hours with a solar selectivity of 10.

In yet another embodiment the solar selective coatings of approximately 4500 Å thickness on copper substrate exhibit a nanoindentation hardness of 1170 kg/mm² at a load of 3 mN.

In yet another embodiment the coatings deposited on silicon substrates show oxidation resistance up to 850° C.

In yet another embodiment the coatings deposited on copper substrate show an order of magnitude improvement in the corrosion resistance.

DETAILED DESCRIPTION OF THE INVENTION

For solar absorber applications, the substrate must have low infrared emittance. In case the substrate does not have the required low infrared emittance, it can be given thin coatings having very high infrared reflectance such as copper and nickel. The present invention makes use of tandem stack of three layers. The first absorber layer consists of TiAlN coating (approximately 500 Å thick). The second absorber layer consists of TiAlON coating (approximately 700 Å thick) and the third layer consists of $Si_3N_4$ (approximately 300 Å thick), which functions as the antireflection coating to further enhance the absorptance of the coating. The candidate materials TiAlN, TiAlON and $Si_3N_4$ for the coating have been chosen with due consideration to their high melting point, high oxidation resistance, high hardness and chemical inertness.

The coatings of the present invention were deposited using a planar reactive direct current magnetron sputtering system consisting of a turbo-molecular pump, a rotary pump, two DC power supplies, an asymmetric bipolar pulsed DC power supply, two planar magnetron sputtering guns, four mass flow controllers, a substrate heater and a vacuum chamber. The coatings were deposited on various substrates. Before putting the substrates into the vacuum chamber, they were metallographically polished to remove the surface oxides and to make the surface homogeneous. The polished substrates were then chemically cleaned using an ultrasonic agitator to remove the grease and other impurities such as dust and debris. Chemically cleaned substrates were positioned underneath the sputtering gun containing titanium-aluminum target. The vacuum chamber was pumped down to a base pressure of the order of $2.0-5.0 \times 10^4$ Pa to remove any gaseous impurities. The substrates were degassed in vacuum by using a substrate heater. In order to remove native oxides on the substrate surface further cleaning was carried out using in situ argon ion bombardment. After cleaning the substrates the first absorber layer was deposited by sputtering of a titanium-aluminum target in the argon-nitrogen plasma at a pressure of the order of $1.0 \times 10^{-1}$ Pa. The first absorber layer contained high metal volume fraction. The second absorber layer was deposited by sputtering of the same titanium-aluminum target in the argon-nitrogen-oxygen plasma at a pressure of the order of $1.0 \times 10^{-1}$ Pa. The second absorber layer contained low metal volume fraction. Subsequently, the third antireflection layer was deposited by sputtering of a silicon target in the argon-nitrogen plasma at a pressure of the order of $1.0 \times 10^{-1}$ Pa by moving the substrate underneath sputtering gun containing silicon target. The tandem stack of three layers effectively increased the absorptance and reduced the emittance of the solar selective coatings. The sputtering of the titanium-aluminum and the silicon targets was carried out using a DC power supply and an asymmetric bipolar pulsed DC power supply, respectively. The sputtering was carried out in top-down geometry, while maintaining a constant target to substrate distance of 5.4 cm. The optical properties (absorptance and emittance) of the samples were measured at four different positions and an average of them is reported herein. The solar selective coatings were annealed in air and vacuum at different temperatures and durations for testing the thermal stability. The thickness of the deposited layers was measured using a surface profilometer. The coatings were characterized using micro-Raman spectroscopy, nanoindentation hardness tester and potentiodynamic polarization techniques.

The following examples are given by way of illustration of the working of the invention in actual practice and therefore should not be construed to limit the scope of the present invention.

EXAMPLE 1

Before putting the substrates into the vacuum chamber the substrates (copper, nickel, stainless steel, glass and nimonic, having dimensions 35 mm×35 mm×2 mm) were metallographically polished and chemically cleaned in an ultrasonic agitator in acetone, absolute alcohol and trichloroethylene. The vacuum chamber was pumped down to a base pressure of $5.0 \times 10^{-4}$ Pa. The pumping system consisted of a turbo-molecular pump backed by a two-stage rotary pump. The substrate to sputtering target distance was 5.4 cm. Subsequently, the substrates were cleaned in situ by argon ion bombardment for 30 minutes, wherein a DC bias of −850 V was applied to the substrate at an argon pressure of $6.0 \times 10^{-1}$ Pa. The solar absorber films were deposited on the substrates using a dual-target reactive direct current magnetron sputtering system. The sputtering guns (diameter=7.5 cm) had planar magnetron geometry. In the present invention to achieve the best quality coatings the sputtering was carried out at power densities of 2.25 and 6.25 watts/cm$^2$ for TiAlN and TiAlON coatings, respectively. TiAlN coatings were prepared from the reactive sputtering of a titanium-aluminum composite target in argon-nitrogen plasma at a pressure of $1.0 \times 10^{-1}$ Pa and at a substrate temperature of approximately 50° C. The flow rate of nitrogen was 2.5 standard cubic centimeter per minute (sccm) for TiAlN deposition. TiAlON coating was deposited using the same titanium-aluminum composite target in argon-nitrogen-oxygen plasma at a pressure of $1.0 \times 10^1$ Pa and at a substrate temperature of approximately 50° C. For TiAlON deposition, nitrogen and oxygen flow rates were 2.0 and 1.5 sccm, respectively. $Si_3N_4$ coating was deposited from the reactive sputtering of silicon target in argon-nitrogen plasma using an asymmetric bipolar-pulsed DC power supply at a pressure of $1.0 \times 10^{-1}$ Pa and at a substrate temperature of 40° C. For the $Si_3N_4$ deposition the power density was 2.0 watts/cm$^2$ and the nitrogen flow rate was 3.5 sccm.

The optical properties (absorptance and emittance) of the samples were measured using standard instruments procured from M/s. Devices and Services, USA. The accuracies for the measurements of the emittance and the absorptance were ±0.01 and ±0.002, respectively.

The absorptance and the emittance values for copper (Cu) substrate, Cu/TiAlN, Cu/TiAlN/TiAlON and Cu/TiAlN/TiAlON/$Si_3N_4$ are given in Table 1. By applying two absorber layers the selectivity ratio increased to 15.2 from 12.9. By applying the antireflection coating of $Si_3N_4$ the absorptance value of the TiAlN/TiAlON tandem could be further increased to 0.958 from 0.910 but a slight decrease in the selectivity ratio was observed because of an increase in the emittance as a result of increase in the coating thickness.

EXAMPLE 2

The solar selective coatings of the present invention as stated in Example 1 were also deposited on other substrates like nickel, stainless steel, aluminum, glass and nickel based superalloy (nimonic). The substrates such as nickel, stainless steel and nimonic are chosen for high temperature applications, since the diffusion of copper into the absorber layer is expected at higher working temperatures, which degrades the optical properties of the absorber layer. In the case of stainless steel and nimonic substrates an additional interlayer of nickel (approximately 1000 Å thick) was given to control the thermal re-radiation losses. The absorptance and the emittance values of the solar selective coating on these substrates are given in Table 2. The emittance values on these substrates are found to be higher (0.13-0.15) as compared to the copper substrate (0.06-0.07).

EXAMPLE 3

The solar selective coatings of the present invention, as deposited in Example 1, were heated in air in a resistive furnace at temperatures in the range of 200-675° C. for a duration of 2 hours to test the thermal stability. Annealing involved increasing the temperature of the sample from room temperature to the desired temperature at a slow heating rate of 3° C./minute and maintaining the desired temperature for 2 hours. Subsequently, the samples were cooled down at a rate of 3° C./minute. The accuracy of the temperature controller was ±1° C. at the set temperature. The absorptance and the emittance values after heat-treatment are listed in Table 3. As seen from Table 3 the optical properties of the coating are not affected considerably even after heating at 625° C. in air. The observed increase in the emissivity above 625° C. is attributed to the diffusion of copper into the coating and its oxidation.

EXAMPLE 4

The solar selective coatings as deposited in Example 1 of the present invention were heat-treated in air for longer durations as per the procedure given in the Example 3. The absorptance and the emittance values after heat-treatment are listed in Table 4. The absorptance and the emittance values of the coatings are around 0.935-0.940 and 0.06-0.09 even after heat-treatment in air at 350° C. (250 hours) and 525° C. (50 hours). Copper substrate heat treated at 350° C. in air for 250 hours under similar conditions showed significant degradation in values of optical properties with α=0.725 and ε=0.45. This indicates that solar selective coatings of the present invention are thermally stable in air even at high temperature conditions.

EXAMPLE 5

The solar selective coatings of the present invention, deposited following the procedure given in Example 1, were also subjected to heat-treatment in vacuum ($5.0 \times 10^{-4}$ Pa) for 3 hours at 600° C. The optical properties of these coatings were measured and are listed in Table 5. No measurable change in the optical properties of the coatings was observed as a result of vacuum annealing. This signifies that one can use the solar selective coating of the present invention for very high temperature applications in vacuum. Comparing this result with that of Table 1, the interesting thing to be noted is that the coatings deposited on copper substrates are also thermally stable at 600° C. in vacuum even without any diffusion barrier layer.

EXAMPLE 6

The solar selective coatings of this invention are also deposited on single crystal silicon substrates (having (100) orientation) following the procedure given in Example 1 and were heated in air for two hours at different temperatures in a resistive furnace up to 950° C. as per the procedure given in the Example 3 to test the oxidation resistance. A DILOR-JOBIN-YVON-SPEX integrated micro-Raman spectrometer (Model Labram) was used to detect the oxides formed due to heating in air. A HeNe 20 mW laser beam was used as the excitation source and the spectrum was recorded in a Peltier cooled CCD detector. The results of this testing are given in Table 6. It can be observed that the oxides are formed only for heating temperature above 850° C. This signifies that the solar selective coatings of the present invention are oxidation resistant up to 850° C.

EXAMPLE 7

The solar selective coatings of the present invention, deposited following the procedure given in Example 1, were subjected to corrosion testing in 3.5% NaCl solution (pH=5.8) in free air condition at room temperature. Potentiodynamic polarization measurements were performed using an Autolab PGSTAT30 galvanostat/potentiostat system. A three-electrode electrochemical cell was used with a platinum counter electrode of 1 $cm^2$ area and an Ag/AgCl, 3M KCl electrode as the reference electrode. The sample to be tested was the working electrode. After thorough cleaning, the sample was kept in the solution for 60 minutes prior to the potentiodynamic polarization study in order to establish the open circuit potential or the steady state potential. After getting the stable open-circuit potential the upper and the lower potential limits of linear sweep voltametry were set at ±200 mV with respect to the open circuit potential, respectively. The sweep rate was 1 mV/sec. The Tafel plots were obtained after the electrochemical measurements. The corrosion potential ($E_{corr}$) and the corrosion current density ($i_{corr}$) were deduced from the Tafel plots (that is, log i vs. E plots). For TiAlN/TiAlON/$Si_3N_4$ solar selective coating deposited on copper substrate the obtained values of $E_{corr}$, $i_{corr}$ and polarization resistance ($R_p$) are displayed in Table 7. The corrosion current density of the coated substrate decreased by a factor of 10, showing improved corrosion resistance of the coating which is due to the chemical inertness of the solar selective coating. This improved corrosion resistance is very significant considering the fact that the thickness of the tandem stack is only 1500 Å.

EXAMPLE 8

Approximately 4500 Å thick solar selective coatings of the present invention deposited on copper substrates, wherein the first absorber layer was approximately 1500 Å thick, the second absorber layer was approximately 2100 Å thick and the third antireflection layer was approximately 900 Å thick, were used for nanoindentation hardness measurements. The hardness measurements were performed in a nanoindentation hardness tester (CSEM Instruments). Indentations were made using a Berkovich diamond indenter at a load of 3 milli-Newton (mN). Both the loading and the unloading rates were set at 6 mN/minute. The thickness of the coating and the indentation load were selected in such a way that the indentation measurements were not influenced by the substrate. Ten indentations were made on the sample to improve the accuracy of the measurements. For each loading/unloading cycle, the load was plotted against the displacement of the indenter. The load/displacement curves were used to calculate the mechanical properties of the coatings. These measurements indicated that about 4500 Å thick solar selective coatings of the present invention exhibited a nanoindentation hardness of about 1170 kg/$mm^2$, which is high as compared to that of uncoated copper substrate (200 kg/$mm^2$), measured under identical conditions. These results indicate that the coatings of the present invention are hard and thus minimal damage can be expected while handling these coatings.

Researchers and inventors have been working on the development of thermally stable solar selective coatings for high temperature applications like solar steam production and solar steam turbines to produce electricity. The most widely used black chromium coating is mainly found suitable for low temperature applications such as hot-water systems. To achieve higher thermal stability, material should have high oxidation resistance, chemical inertness and microstructure stability. The material should also have a graded composition to get the required selectivity. The candidate materials selected for the solar selective coatings of the present invention include nitrides and/or oxynitrides of titanium-aluminum and silicon, which are known to have the required above properties. In this invention, a three-layer tandem stack has been deposited using a planar reactive direct current magnetron sputtering process, which is a dry and green process. The first absorber layer of this coating was tailor-made to have high metal volume fraction as compared to the second absorber layer to enhance the absorptance of the coating. The third antireflection layer is given to reduce the infrared emittance so as to increase the absorptance of the coating further, without an increase in the emittance. The candidate materials have also been chosen carefully so that the interdiffusion between the layers of the tandem stack is minimal for the working temperatures reported in the present invention.

Followings are the Main Advantages of the Present Invention:
1. The present invention uses a dry, clean and green process for the manufacture of solar selective coatings.
2. The solar selectivity for coatings of the present invention is very high (up to 15 on copper substrates).
3. The present invention provides substantially improved solar selective coating in respect of thermal stability.
4. Solar selective coatings of the present invention has not shown any degradation in the optical properties even after heating in air up to 625° C. for 2 hours and also in vacuum at 600° C. for 3 hours.
5. The present invention provides reliable and long service life solar selective coatings for high temperature applications in industry.
6. Process of the present invention is also useful for coating automobile components like exhaust pipe and silencers.
7. The coating of the present invention has high hardness and chemical inertness since it contains nitrides/oxynitrides of titanium-aluminum and silicon.

TABLE 1

Absorptance, emittance and solar selectivity of different layers of the solar selective coating system of the present invention. Also shown are the values of copper substrate.

| Material | α | ∈ | α/∈ |
|---|---|---|---|
| Cu substrate | 0.215 | 0.03 | 7.2 |
| Cu/TiAlN | 0.772 | 0.06 | 12.9 |
| Cu/TiAlN/TiAlON | 0.910 | 0.06 | 15.2 |
| Cu/TiAlN/TiAlON/Si$_3$N$_4$ | 0.958 | 0.07 | 13.7 |

TABLE 2

Absorptance, emittance and solar selectivity of solar selective coatings deposited on various substrates.

| Substrate Material | α | ∈ | α/∈ |
|---|---|---|---|
| Copper | 0.958 | 0.07 | 13.7 |
| Glass | 0.933 | 0.07 | 13.3 |
| Aluminum | 0.911 | 0.15 | 6.1 |
| Nickel | 0.934 | 0.14 | 6.7 |
| Stainless steel | 0.958 | 0.13 | 7.4 |
| Nimonic | 0.946 | 0.14 | 6.8 |

TABLE 3

Effect of 2 hours annealing (in air) on optical properties of the TiAlN/TiAlON/Si$_3$N$_4$ solar selective coatings deposited on copper substrates.

| Annealing Temperature ° C. | α As-deposited | α Annealed | Δα | ∈ As-deposited | ∈ Annealed | Δ∈ |
|---|---|---|---|---|---|---|
| 200 | 0.946 | 0.946 | 0.000 | 0.07 | 0.07 | 0.00 |
| 300 | 0.947 | 0.946 | 0.001 | 0.07 | 0.07 | 0.00 |
| 400 | 0.939 | 0.929 | 0.010 | 0.06 | 0.06 | 0.00 |
| 500 | 0.944 | 0.929 | 0.015 | 0.05 | 0.05 | 0.00 |
| 550 | 0.939 | 0.928 | 0.011 | 0.06 | 0.07 | 0.01 |
| 600 | 0.944 | 0.927 | 0.017 | 0.08 | 0.10 | 0.02 |
| 625 | 0.934 | 0.906 | 0.028 | 0.07 | 0.08 | 0.01 |
| 650 | 0.943 | 0.899 | 0.044 | 0.06 | 0.26 | 0.20 |
| 675 | 0.947 | 0.891 | 0.056 | 0.07 | 0.33 | 0.26 |

TABLE 4

Effect of annealing (in air) on optical properties of TiAlN/TiAlON/Si$_3$N$_4$ solar selective coatings on copper substrates for longer durations.

| Temperature (° C.) | Time (hrs.) | α As-deposited | α Annealed | Δα | ∈ As-deposited | ∈ Annealed | Δ∈ |
|---|---|---|---|---|---|---|---|
| 350 | 250 | 0.942 | 0.935 | 0.007 | 0.07 | 0.06 | 0.01 |
| 525 | 50 | 0.943 | 0.940 | 0.003 | 0.07 | 0.09 | 0.02 |

TABLE 5

Effect of vacuum annealing (5.0 × 10⁻⁴ Pa) at 600° C. for 3 hours on optical properties of TiAlN/TiAlON/Si$_3$N$_4$ solar selective coatings deposited on copper, nimonic and stainless steel substrates.

| | α | | | ε | | |
|---|---|---|---|---|---|---|
| Substrate | As-deposited | Annealed | Δα | As-deposited | Annealed | Δε |
| Copper | 0.941 | 0.941 | 0.000 | 0.08 | 0.09 | 0.01 |
| Nimonic | 0.952 | 0.950 | 0.002 | 0.12 | 0.14 | 0.02 |
| Stainless steel | 0.944 | 0.952 | 0.008 | 0.14 | 0.18 | 0.04 |

TABLE 6

Various oxide phases formed as a result of annealing in air for 2 hours of TiAlN/TiAlON/Si$_3$N$_4$ solar selective coatings deposited on silicon substrates.

| Sl. No. | Annealing Temperature (° C.) | Various oxide phases detected using micro-Raman spectroscopy |
|---|---|---|
| 1. | 800 | None |
| 2. | 850 | None |
| 3. | 900 | TiO$_2$ (rutile) and Al$_2$O$_3$ |
| 4. | 950 | TiO$_2$ (rutile) and Al$_2$O$_3$ |

TABLE 7

Potentiodynamic polarization data of TiAlN/TiAlON/Si$_3$N$_4$ solar selective coatings on copper substrate in 3.5% NaCl solution. Also, shown are the values for copper substrate.

| Material | $i_{corr}$ (μA/cm$^2$) | $E_{corr}$ (V) | $R_p$ (kΩ cm$^2$) |
|---|---|---|---|
| Cu (Substrate) | 0.7636 | −0.189 | 21.07 |
| Cu/TiAlN/TiAlON/Si$_3$N$_4$ | 0.0694 | −0.155 | 242.10 |

The invention claimed is:

1. A thermally stable solar selective coating useful for harnessing solar energy comprising a first solar absorber layer of TiAlN being deposited on a substrate selected from the group consisting of glass, silicon and metal, a second solar absorber layer of TiAlON deposited on the first solar absorber layer and a third antireflection layer of Si$_3$N$_4$ deposited on the second solar absorber layer.

2. A thermally stable solar selective coating according to claim 1, wherein the elements used in depositing the first absorber layer are Ti, Al and N.

3. A thermally stable solar selective coating according to claim 1, wherein the elements used in depositing the second absorber layer are Ti, Al, O and N.

4. A thermally stable solar selective coating according to claim 1, wherein the elements used in depositing the antireflection layer are Si and N.

5. A thermally stable solar selective coating according to claim 1, wherein a titanium-aluminum composite target is sputtered in the presence of nitrogen-argon plasma for the deposition of first absorber layer of TiAlN.

6. A thermally stable solar selective coating according to claim 1, wherein a titanium-aluminum composite target is sputtered in the presence of nitrogen-argon-oxygen plasma for the deposition of second absorber layer of TiAlON.

7. A thermally stable solar selective coating according to claim 1, wherein silicon target is sputtered in the presence of nitrogen-argon plasma for the deposition of third antireflection layer of Si$_3$N$_4$.

8. A thermally stable solar selective coating useful for harnessing solar energy comprising a first absorber layer of TiAlN being deposited on a substrate selected from the group consisting of glass, silicon and metal, a second solar absorber layer of TiAlON deposited on the first solar absorber layer and a third antireflection layer of Si$_3$N$_4$ deposited on the second solar absorber layer, wherein the solar selective coating has the following characteristics:
  i) a first absorber layer thickness of 300-500 A, a second absorber layer thickness of 400-800 A and a third antireflection layer thickness of 300-500 A; and
  ii) exhibits substantially no degradation in optical properties when heated in vacuum (5.0×10⁻⁴ Pa) for a duration of 3 hours at 600° C.

9. A thermally stable solar selective coating according to claim 8, wherein the substrate is copper.

10. A thermally stable solar selective coating according to claim 9, wherein the solar selective coating has an absorptance value of 0.92-0.95 and an emittance value of 0.06-0.08.

11. A thermally stable solar selective coating according to claim 9, wherein the solar selective coating exhibits substantially no degradation in optical properties when heated in air up to 600° C. for a duration of 2 hours and provides a solar selectivity of 9-10.

12. A thermally stable solar selective coating according to claim 9, wherein the solar selective coating exhibits substantially no degradation in optical properties when heated in air at 525° C. for a duration of 50 hours and provides a solar selectivity of 10.

13. A thermally stable solar selective coating according to claim 9, wherein the solar selective coating, at a thickness of 4500 A exhibits a nanoindentation hardness of 1170 kg/mm$^2$ at a load of 3 mN.

14. A thermally stable solar selective coating according to claim 8, wherein the substrate is silicon and the solar selective coating exhibits oxidation resistance up to 850° C.

* * * * *

UNITED STATES PATENT AND TRADEMARK OFFICE
CERTIFICATE OF CORRECTION

PATENT NO. : 7,585,568 B2
APPLICATION NO. : 11/466266
DATED : September 8, 2009
INVENTOR(S) : Harish Chandra Barshilia et al.

It is certified that error appears in the above-identified patent and that said Letters Patent is hereby corrected as shown below:

on the cover page, item (75) inventors, line 2, change "Vatika" to --Vatia--

Signed and Sealed this

Eighth Day of June, 2010

David J. Kappos
*Director of the United States Patent and Trademark Office*